US010297751B2

(12) United States Patent
Yi et al.

(10) Patent No.: US 10,297,751 B2
(45) Date of Patent: May 21, 2019

(54) LOW-VOLTAGE THRESHOLD SWITCH DEVICES WITH CURRENT-CONTROLLED NEGATIVE DIFFERENTIAL RESISTANCE BASED ON ELECTROFORMED VANADIUM OXIDE LAYER

(71) Applicant: HRL Laboratories, LLC, Malibu, CA (US)

(72) Inventors: Wei Yi, Moorpark, CA (US); Thomas C. Oh, Los Angeles, CA (US); Jack A. Crowell, Camarillo, CA (US); Elias A. Flores, Oxnard, CA (US); Philip A. King, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/417,049

(22) Filed: Jan. 26, 2017

(65) Prior Publication Data

US 2018/0212145 A1 Jul. 26, 2018

(51) Int. Cl.
*H01L 45/00* (2006.01)
*H01L 27/24* (2006.01)
*G11C 13/00* (2006.01)

(52) U.S. Cl.
CPC ........ *H01L 45/146* (2013.01); *G11C 13/0007* (2013.01); *G11C 13/0069* (2013.01); *H01L 27/2418* (2013.01); *H01L 45/1233* (2013.01); *H01L 45/1253* (2013.01); *H01L 45/1608* (2013.01); *H01L 45/1641* (2013.01); *G11C 2013/0083* (2013.01)

(58) Field of Classification Search
CPC ............... H01L 45/146; H01L 27/2418; H01L 45/1233; G11C 13/0069
See application file for complete search history.

(56) References Cited

U.S. PATENT DOCUMENTS 3,483,110 A * 12/1969 Rozgonyi ............. C23C 14/083 148/277
6,426,891 B1 * 7/2002 Katori ...................... G11C 7/04 257/E27.004
(Continued)

FOREIGN PATENT DOCUMENTS

CA 2285160 A1 * 4/2000 ......... C03C 17/3417

OTHER PUBLICATIONS

Pergament et al. ("Phase composition of anodic oxide films on transition metals: a thermodynamic approach", Thin Solid Films, 1998).*
(Continued)

*Primary Examiner* — Mushfique Siddique
(74) *Attorney, Agent, or Firm* — Ladas & Parry

(57) ABSTRACT

An electronic device comprising a substrate having a surface; a first electrode wire extending on said surface along a first direction; a vanadium pentoxide layer extending on and contacting at least a portion of said first electrode; a second electrode wire extending over said surface along a second direction, such that the second electrode wire extends on and contacts at least a portion of the vanadium pentoxide layer above the first electrode wire at a crossing point; wherein a region of vanadium dioxide is included in said vanadium pentoxide layer between the first and second electrodes at said crossing point.

24 Claims, 12 Drawing Sheets

(56) References Cited

U.S. PATENT DOCUMENTS

| | | | | |
|---|---|---|---|---|
| 8,525,553 | B1 * | 9/2013 | Yi | H03K 3/313 326/132 |
| 8,767,449 | B2 * | 7/2014 | Pickett | G11C 11/39 365/148 |
| 8,854,860 | B2 * | 10/2014 | Ribeiro | G11C 13/0007 365/148 |
| 9,627,490 | B1 * | 4/2017 | Eom | H01L 21/02488 |
| 9,859,001 | B2 * | 1/2018 | Lee | G11C 13/0069 |
| 2006/0011942 | A1 * | 1/2006 | Kim | H01L 45/04 257/192 |
| 2009/0184305 | A1 * | 7/2009 | Lee | G11C 13/0007 257/2 |
| 2010/0051892 | A1 * | 3/2010 | Mikawa | H01L 27/101 257/2 |
| 2011/0134579 | A1 | 6/2011 | Hsu | |
| 2012/0014161 | A1 * | 1/2012 | Pickett | H03B 7/06 365/148 |
| 2012/0075907 | A1 * | 3/2012 | Jo | G11C 11/22 365/148 |
| 2012/0085985 | A1 * | 4/2012 | Yang | B82Y 10/00 257/9 |
| 2012/0099362 | A1 * | 4/2012 | Ribeiro | G11C 13/0007 365/148 |
| 2012/0104346 | A1 * | 5/2012 | Yi | H01L 45/085 257/4 |
| 2012/0132882 | A1 * | 5/2012 | Seo | H01L 27/12 257/4 |
| 2012/0138885 | A1 * | 6/2012 | Wu | H01L 45/04 257/5 |
| 2012/0249252 | A1 | 10/2012 | Borghetti | |
| 2012/0286743 | A1 * | 11/2012 | Soltani | H01G 4/33 320/166 |
| 2012/0321938 | A1 * | 12/2012 | Oukassi | H01M 2/204 429/162 |
| 2013/0021835 | A1 * | 1/2013 | Hwang | G11C 13/0002 365/148 |
| 2013/0099187 | A1 | 4/2013 | Pickett | |
| 2013/0106480 | A1 * | 5/2013 | Ribeiro | G11C 13/0007 327/192 |
| 2013/0155572 | A1 * | 6/2013 | Popovici | H01L 28/56 361/305 |
| 2013/0176766 | A1 * | 7/2013 | Pickett | G11C 11/39 365/148 |
| 2013/0242637 | A1 * | 9/2013 | Yang | G11C 13/0002 365/148 |
| 2013/0250420 | A1 * | 9/2013 | Yang | G02F 1/015 359/573 |
| 2014/0003139 | A1 * | 1/2014 | Pickett | G11C 11/39 365/159 |
| 2014/0029327 | A1 * | 1/2014 | Strachan | H01L 45/04 365/148 |
| 2014/0029330 | A1 * | 1/2014 | Muraoka | H01L 27/101 365/148 |
| 2014/0214738 | A1 | 7/2014 | Pickett | |
| 2014/0225646 | A1 * | 8/2014 | Pickett | G11C 8/10 326/105 |
| 2014/0252296 | A1 * | 9/2014 | Chueh | H01L 45/146 257/3 |
| 2014/0268995 | A1 * | 9/2014 | Joo | H01L 45/06 365/148 |
| 2014/0292428 | A1 | 10/2014 | Koyama | |
| 2015/0053909 | A1 * | 2/2015 | Yang | H01L 45/08 257/4 |
| 2015/0137061 | A1 * | 5/2015 | Donghi | H01L 27/2463 257/4 |
| 2015/0194203 | A1 * | 7/2015 | Pickett | H01L 47/00 365/148 |
| 2016/0233251 | A1 * | 8/2016 | Sasaki | H01L 27/1225 |
| 2016/0260779 | A1 * | 9/2016 | Kawashima | H01L 27/2481 |
| 2016/0285022 | A1 * | 9/2016 | Gotanda | H01L 51/0012 |
| 2017/0040054 | A1 * | 2/2017 | Friedman | G11C 13/004 |
| 2017/0219444 | A1 * | 8/2017 | Kim | G01K 11/32 |

OTHER PUBLICATIONS

"Current-Induced Electrical Self-Oscillations Across Out-Of-Plane Threshold Switches Based on V02 Layers Integrated in Crossbars Geometry" by A. Beaumont, J. Leroy, J.-C. Orlianges, and A. Crunteanu, J. Appl. Phys. 115, 154502 (2014).

"Filament Formation in Switching Devices Based on V20s Gel Films", by J-G. Zhang and P. C. Eklund, J. Mater. Res. 8, 558 (1993).

"A scalable neuristor built with Mott memristors" by M. D. Pickett, G. Medeiros-Ribeiro and R. S. Williams, Nature Mater. 12, 114 (2013).

Electrical Switching in Thin Film Structures Based on Transition Metal Oxides A. Pergament, G. Stefanovich, V. Malinenko, and A. Velichko Faculty of Physical Engineering, Petrozavodsk State University, Petrozavodsk 185910, Russia (2015).

PCT International Search Report and Written Opinion from PCT/US2018/015110 dated May 8, 2018.

* cited by examiner

LOW-VOLTAGE THRESHOLD SWITCH DEVICES WITH CURRENT-CONTROLLED NEGATIVE DIFFERENTIAL RESISTANCE BASED ON ELECTROFORMED VANADIUM OXIDE LAYER

TECHNICAL FIELD

This presentation relates to resistive switching, and in particular to low-voltage metal-oxide-metal (MOM) bidirectional threshold switch devices having a current-controlled (S-type) negative differential resistance using an electroformed vanadium oxide layer or film; and to methods of making thereof.

BACKGROUND

One-port (two-terminal) devices exhibiting a negative differential resistance (NDR) in its current-voltage (I-V) relationship are locally-active circuit elements. With a proper external circuitry, so that the signal lies within the negative resistance region of the I-V curve, the device can have an AC power gain greater than 1 and serve as an amplifier, or excite oscillations in a resonant circuit to make an oscillator. Unlike in a two-port amplifying device such as a transistor or operational amplifier, the input signal and the amplified output signal share the same two terminals (port) of the device.

Generally NDR devices are classified into two categories: current-controlled (CC-NDR), or S-type (both terms, CC-NDR and S-type NDR, will be used equivalently in this presentation); and voltage-controlled (VC-NDR), or N-type. N-type NDR devices are readily available and come in a variety of device structures and operating mechanisms, including Esaki diodes, resonant tunnel diodes (RTD), Gunn diodes, impact ionization avalanche transit time (IMPATT) diodes, and tunnel injection transit time (TUNNETT) diodes. However, these devices are normally "On", meaning that they are at low-resistance states when powered off, and therefore are not suitable for applications that require low standby power dissipation, such as spike-based neuromorphic computing.

On the other hand, S-type NDR devices are normally "Off", meaning that they are at high-resistance states when powered off, and therefore are well suited for applications that require very low standby power dissipation. However, S-type NDR devices are rare and not readily available. A familiar type of S-type NDR device is threshold switch, such as Si PNPN devices (or thyristors), including unidirectional silicon-controlled rectifiers (SCRs) or programmable unijunction transistors (PUTs), and bidirectional triacs. The equivalent circuit of a thyristor is a pair of PNP and NPN bipolar junction transistors (BJTs) with appropriate connections to form an internal feedback loop. However, Si thyristors are mainly used for power control applications, the minimal threshold voltage (current) of commercially available discrete Si thyristors are typically 7-9V (200 μA) or larger, which is too high for many low-power applications. Although the threshold voltage can be reduced to 1-2V range by controlling the gate trigger current, additional circuit element such as a low-breakdown-voltage Zener diode is required, which adds the circuit overhead and complexity. Another important drawback of Si based PNPN devices is that they are non-stackable and have poor lateral scalability, thus severely limiting the network scale and device density for neuromorphic applications.

For spiking-neuron based neuromorphic computing applications, S-type NDR MOM threshold switching devices are envisioned to have advantages in scalability, switching speed, energy consumption, and biological fidelity, as compared with existing Si CMOS based solutions: superior scalability owing to the MOM crossbar geometry with a $4F^2$ scaling, F being the half pitch of lithography; superior stackability owing to the thin-film deposition fabrication process of the active layer, effectively enhance the $4F^2$ scaling to $4F^2/N$ (N being the number of the active layers); less-than 10 picosecond switching speed owing to the ultra-fast Mott Insulator-to-Metal Transition (IMT); ultra-low energy consumption owing to the low IMT transition temperature and scalable active element; and higher biological fidelity and complexity owing to the inherent biomimetic nonlinear dynamics and stochasticity.

Certain types of MOM devices with a thin layer of transition metal oxides (TMO) are known to be threshold switches. Several TMO materials are known to follow Mott physics and possess a thermodynamically driven simultaneous structural and electronic first-order quantum phase transition from an insulator to metal as the material is heated beyond a characteristic critical temperature. Examples include binary oxides with Magneli phases, $M_nO_{2n-1}$ (M being V, Nb, Ti cations, n being an integer); or ternary perovskite-type oxides, $RMO_3$ (R being rare earth cations such as Pr, Nd, Sm; M being 3d transition metals such as Ni and Co). However, many such materials have a cryogenic transition temperature, making it challenging for typical electronic applications. Materials with a transition temperature at above room temperature, such as $VO_2$, $NbO_2$, $Ti_2O_3$, and $Ti_3O_3$, are more suitable for such applications.

The reference: "Current-Induced Electrical Self-Oscillations Across Out-Of-Plane Threshold Switches Based on $VO_2$ Layers Integrated In Crossbars Geometry" by A. Beaumont, J. Leroy, J.-C. Orlianges, and A. Crunteanu, J. Appl. Phys. 115, 154502 (2014), describes a $VO_2$-based vertical MOM crossbar threshold switch with threshold voltages down to 0.8V. In this reference, the $VO_2$ films were deposited on c-sapphire substrates at temperatures near 500 degree C. FIG. 1 schematically shows an elevation view of a MOM switch 10 of this reference, having a first metal electrode 12 formed on a c-sapphire substrate 14, both the electrode 12 and the substrate 14 not covered by the electrode being covered by a blanket film/layer 16 of $VO_2$. A second metal electrode 18 is formed on top layer 16, thus sandwiching a portion of layer 16 between electrodes 12 and 18 at a crossing point 20. The Inventors have noted that a main issue of this known device is that the process using sapphire substrates and high growth temperatures is not compatible with Si CMOS back end of line (BEOL) processes, which posts a major barrier for adoption in large-scale integrated circuits (ICs) required for neuromorphic applications. Most of such ICs still require CMOS peripheral circuitry to support functions such as voltage supplies, data communication, analog/digital conversion, and input/output interfaces.

The reference "Filament Formation in Switching Devices Based on $V_2O_5$ Gel Films", by J-G. Zhang and P. C. Eklund, J. Mater. Res. 8, 558 (1993), describes electroforming of lateral MOM devices (with a metal-to-metal gap of 150 μm) based on $V_2O_5.1.6H_2O$ sol gel films. S-type NDR I-V characteristics and resistance switching were observed after electroforming by applying a voltage typically 25-30V. The switching threshold voltage of the MOM devices of this reference is typically 10V. Further, the sol-gel film process and large metal-to-metal gap (150 μm) of the lateral device structure of this reference are not practical for IC applications.

The reference "A scalable neuristor built with Mott memristors" by M. D. Pickett, G. Medeiros-Ribeiro and R. S. Williams, Nature Mater. 12, 114 (2013), discloses using 6V and 1 microsecond electroforming pulses to form local $NbO_2$ channel in a $Nb_2O_5$ crossbar device.

What is needed is an IC process compatible S-type NDR MOM low voltage threshold switching device using a TMO having a transition temperature at above room temperature. The embodiments of this presentation address these and other needs.

SUMMARY

This presentation discloses an electronic device that is based on an electroformed vanadium dioxide layer or film. The device can be used as a low voltage threshold switch with current controlled (S-type) negative differential resistance in certain operating region. This presentation also discloses a device comprising a vanadium pentoxide insulating layer that can be controllably transformed into the above vanadium dioxide low voltage threshold switch device. This presentation also discloses methods of making the above structures.

An embodiment of this presentation relates to an electronic device comprising: a substrate having a surface; a first electrode wire or strip extending on said surface along a first direction; a vanadium pentoxide film extending on and contacting at least a portion of said first electrode; a second electrode wire or strip extending over said surface along a second direction, such that the second electrode wire extends on and contacts at least a portion of the vanadium pentoxide layer above the first electrode wire at a crossing point; wherein a region of vanadium dioxide is included in said vanadium pentoxide layer between the first and second electrodes at said crossing point.

According to an embodiment of this presentation, said vanadium pentoxide layer is disposed within a recess in a dielectric film or layer formed over said first electrode and the at least part of said surface not covered by said electrode.

According to an embodiment of this presentation, said first electrode fills a trench formed in said surface.

According to an embodiment of this presentation, a top surface of said first electrode is flush with the surface of the substrate on the side of said trench.

According to an embodiment of this presentation, the substrate is a Si substrate covered with a layer of $SiO_2$, $SiN_x$, SiCN, SiCOH or porous SiCOH.

According to an embodiment of this presentation, at least one of the first and second electrode wires comprises one layer or multiple layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon.

According to an embodiment of this presentation, one of the first and the second electrode wires comprises a protrusion extending normal to said surface toward the other of the first and second electrode wires in said region of vanadium dioxide.

An embodiment of this presentation relates to a programmable electronic device comprising: a substrate having a surface; a first electrode wire extending on said surface along a first direction; a vanadium pentoxide layer extending on and contacting at least a portion of said first electrode; a second electrode wire extending over said surface along a second direction, such that the second electrode wire extends on and contacts at least a portion of the vanadium pentoxide layer above the first electrode wire at a crossing point; wherein said vanadium pentoxide layer comprises a region of heightened conductivity or of reduced thickness between the first and second electrode wires at said crossing point.

According to an embodiment of this presentation, said vanadium pentoxide layer comprises a region of reduced thickness between the first and second electrode wires at said crossing point, wherein said region reduced thickness comprises a protrusion in one of the first and the second electrode wires, said protrusion extending normal to said surface toward the other of the first and second electrode wires.

According to an embodiment of this presentation, said vanadium pentoxide layer comprises a region of heightened conductivity between the first and second electrode wires at said crossing point; wherein said region of heightened conductivity comprises vanadium pentoxide depleted of oxygen.

According to an embodiment of this presentation, the programmable electronic device additionally comprises a commutator for controllably connecting in series between the first and second electrode wires a current limiting resistor and a controllable voltage source; the controllable voltage source being provided for increasing the voltage between the first and second electrode wires until the current in the current limiting resistor reaches a predetermined level.

According to an embodiment of this presentation, said vanadium pentoxide layer is comprised within a recess in a dielectric layer formed over said first electrode and the portions of said surface not covered by said electrode.

According to an embodiment of this presentation, said first electrode fills a trench formed in said surface.

According to an embodiment of this presentation, a top surface of said first electrode is flush with the surface of the substrate on the side of said trench.

An embodiment of this presentation relates to a method of manufacturing an electronic device comprising: providing a substrate having a surface; forming a first electrode wire along a first direction on said surface; forming a vanadium pentoxide layer on and in contact with at least a portion of said first electrode; and forming a second electrode wire along a second direction over said surface, such that the second electrode wire extends on and contacts at least a portion of the vanadium pentoxide layer above the first electrode wire at a crossing point.

According to an embodiment of this presentation, the method comprises forming a region of reduced thickness in the vanadium pentoxide layer by forming in one of the first and the second electrode wires a protrusion extending normal to said surface toward the other of the first and second electrode wires.

According to an embodiment of this presentation, said protrusion is substantially conical, with an axis normal to said surface.

According to an embodiment of this presentation, the method further comprises forming a region of heightened conductivity in the vanadium pentoxide layer between the first and second electrode wires at said crossing point.

According to an embodiment of this presentation, said forming a region of heightened conductivity in the vanadium pentoxide layer comprises locally depleting the vanadium pentoxide of oxygen in said region of the vanadium pentoxide layer.

According to an embodiment of this presentation, said depleting the vanadium pentoxide of oxygen comprises using one of: a reductive contact metals; a high-energy electron bombardment; a high energy ion beam bombardments; and a hydrogen reduction.

According to an embodiment of this presentation, said forming a vanadium pentoxide layer on and in contact with at least a portion of said first electrode comprises: forming a dielectric layer formed over said first electrode and the portions of said surface not covered by said electrode; etching a recess in said dielectric layer over said at least a portion of said first electrode; and forming a vanadium pentoxide layer within said recess.

According to an embodiment of this presentation, said forming a first electrode wire along a first direction on said surface comprises etching a trench in said surface; and filling said trench with said first electrode.

According to an embodiment of this presentation, a top surface of said first electrode is flush with the surface of the substrate on the side of said trench.

According to an embodiment of this presentation, the substrate is a Si substrate covered with a layer of $SiO_2$, $SiN_x$, SiCN, SiCOH or porous SiCOH.

According to an embodiment of this presentation, at least one of the first and second electrode wires comprises one layer or multiple layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon.

According to an embodiment of this presentation, the method further comprises electroforming a region of vanadium dioxide in said region of heightened conductivity in the vanadium pentoxide layer.

According to an embodiment of this presentation, said electroforming a region of vanadium dioxide in said region of heightened conductivity in the vanadium pentoxide layer comprises: connecting in series between the first and second electrode wires a current limiting resistor and a controllable voltage source; and with the controllable voltage source, increasing the voltage between the first and second electrode wires until the current in the current limiting resistor reaches a predetermined level.

An embodiment of this presentation relates to a memory cell having a first resistance in a first, un-programmed state “0” (the virgin state); a second resistance in a second state “1” that is statically programmable from the first state; and a third resistance in a third state “2” that is dynamically programmable from the second state. According to an embodiment of this presentation, the memory cell is a two electrode cell and the first, second and third resistances are measured between the two electrodes. According to an embodiment of this presentation, the memory cell comprises between the two electrodes a region of vanadium pentoxide in the first state “0”. Programming the memory cell into the second state “1” comprises electroforming a vanadium dioxide region in the vanadium pentoxide region, with the vanadium dioxide region having a default high resistance value. According to an embodiment of this presentation, programming the memory cell from the second state “1” into the third state “2” comprises electrically maintaining the vanadium dioxide region to a low resistance value.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the claimed invention.

Figure 1:
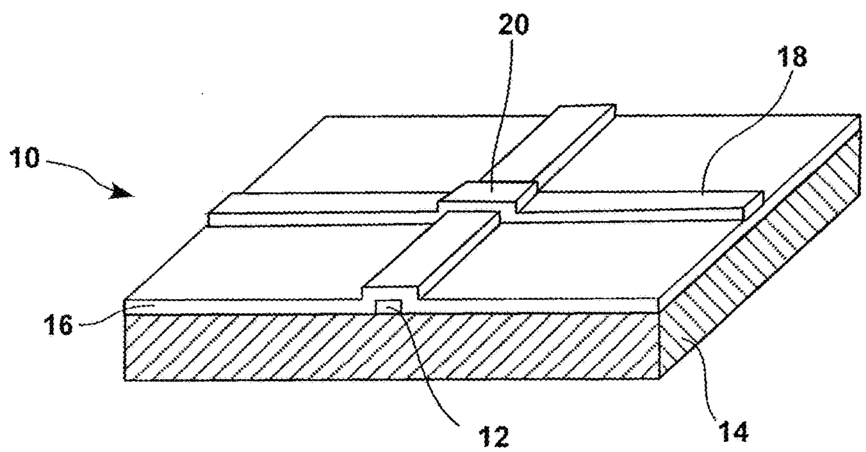
FIG. 1 schematically shows an elevation view of a known MOM threshold switch.
Figure 2:
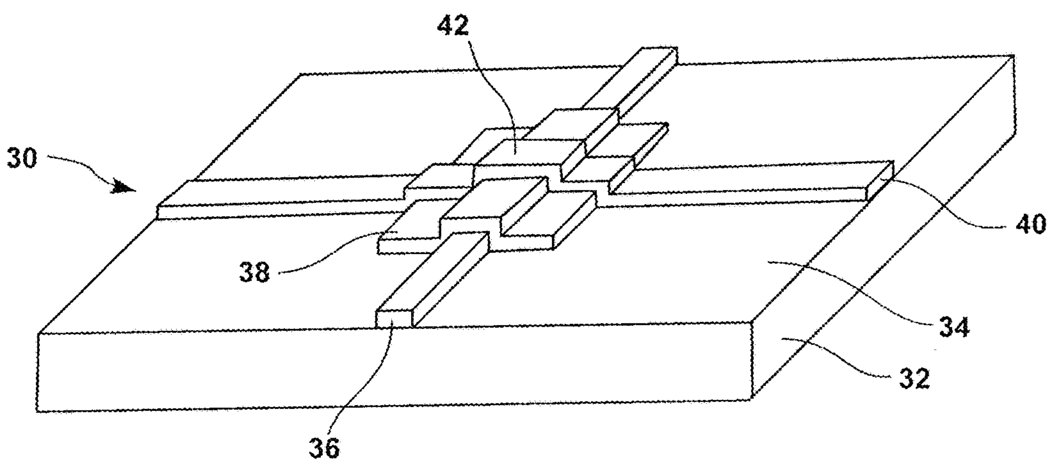
FIG. 2 schematically shows an elevation view of a MOM threshold switch according to this presentation.

FIG. 2 schematically shows an elevation view of a MOM threshold switch 30 according to this presentation, comprising: a substrate 32 having a surface 34; a first electrode wire 36 extending on surface 34 along a first direction and a vanadium pentoxide film or layer 38 extending on and contacting at least a portion of first electrode 36. A second electrode wire 40 extends over surface 34 along a second direction, such that the second electrode wire 40 extends on and contacts at least a portion of the vanadium pentoxide layer 38 over the first electrode wire 36 at a crossing point 42. According to an embodiment of this presentation, a region of vanadium dioxide (not shown in FIG. 2) is included in vanadium pentoxide layer 38 between the first electrode 36 and the second electrode 40 at crossing point 42.

According to an embodiment of this presentation, the electrodes 36 and 40 can be single-layer or multilayered metallic wires containing one or more CMOS foundry-compatible elemental metals and metal alloys, metal nitrides, and metal silicides. Examples include, but are not limited to, Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon. According to embodiments of this presentation, each electrode wire can be composed of multiple layers of metal; having a bulk of interconnect metal comprising one of W, Al, or Cu, and an interfacial metal layer comprising one of nitrides, silicides, and poly-Si. According to an embodiment of this presentation, the height and width of electrodes 36 and 40 are only limited by the lithography technique used. For example, the width and height can vary from less than 10 nanometer to tens of microns.

Figure 3A:
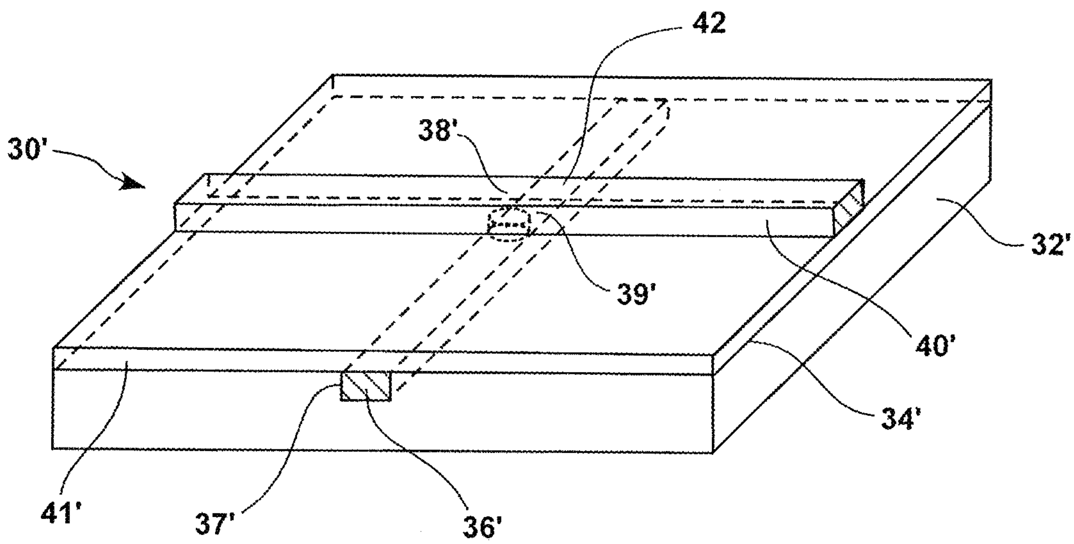
FIG. 3A schematically shows an elevation view of a MOM threshold switch according to this presentation.

FIG. 3A schematically shows an elevation view of a MOM threshold switch 30' according to this presentation, comprising: a substrate 32' having a surface 34'; a first electrode wire 36' filling a trench 37' extending on surface 34' along a first direction. According to an embodiment of this presentation, a layer 41' of $SiO_2$ (or of another common CMOS compatible dielectric such as SiNx, SiCN, SiCOH or porous SiCOH) covers a planary surface comprising all of the surface 34' that does not comprise trench 37' as well as all the top surface of wire/layer 36' in trench 37'. According to an embodiment of this presentation, 36'*a* vanadium pentoxide film or layer 38' fills a recess 39' traversing layer 41' such that vanadium pentoxide layer 38' extends on and contacts a portion of first electrode 36'. The substrate 32' can be of the same material as layer 41'. A second electrode wire 40' extends over layer 41' (and thus over surface 34') along a second direction, such that the second electrode wire 40' extends on and contacts at least a portion of the vanadium pentoxide layer 38' above the first electrode wire 36' at a crossing point 42'. According to an embodiment of this presentation, a region of vanadium dioxide (not shown in FIG. 3A) is included in vanadium pentoxide layer 38' between the first electrode 36' and the second electrode 40' at crossing point 42'. According to an embodiment of this presentation, the region of vanadium dioxide is generally vertical and is preferably close to the geometric center of the vanadium pentoxide layer 38'.

According to an embodiment of this presentation, the electrodes 36' and 40' can have the same structure as electrodes 36 and 40 above.

Figure 3B:
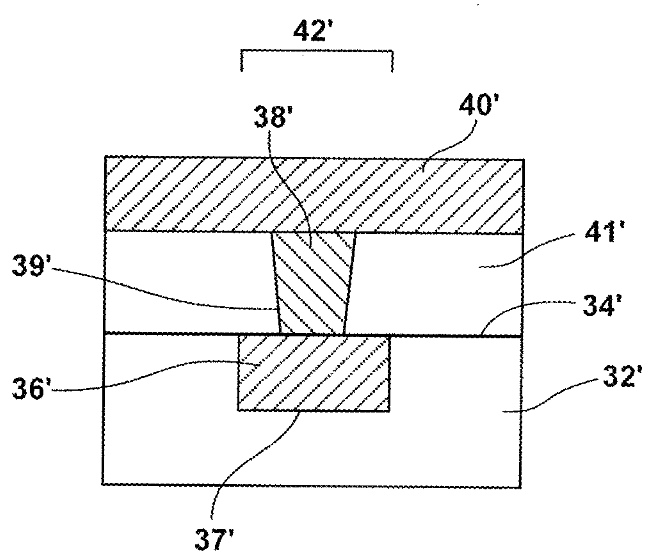
FIG. 3B schematically shows a cross section of a portion of the MOM threshold switch of FIG. 3A.

FIG. 3B illustrates a cross section of a portion of MOM threshold switch 30', along a plane normal to electrode 37'. According to an embodiment of this presentation, vanadium pentoxide region 38' can be substantially cylindrical or it can have the shape of the trunk of a cone, as illustrated in FIG. 3B.

Figure 4A:
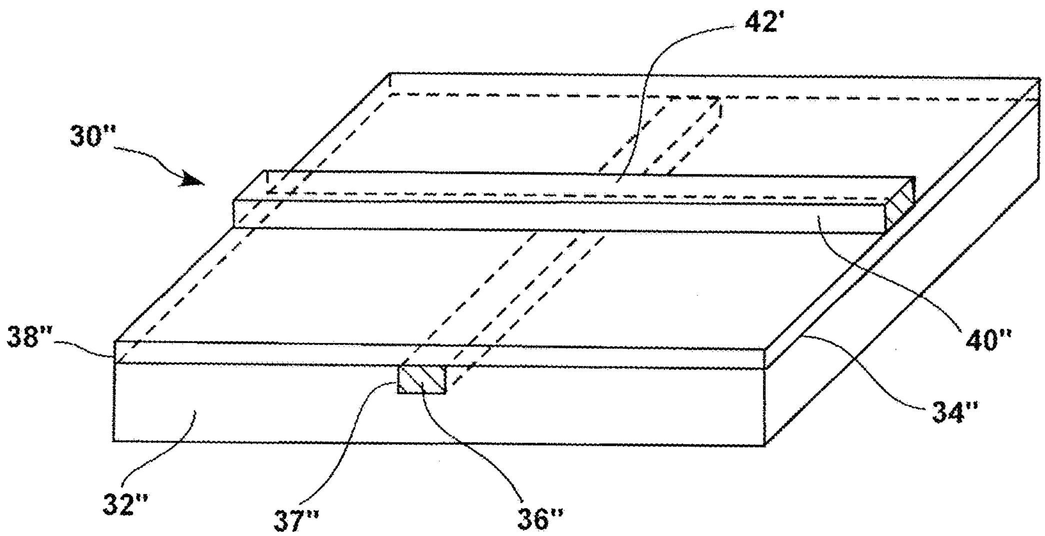
FIG. 4A schematically shows an elevation view of a MOM threshold switch according to this presentation.

FIG. 4A schematically shows an elevation view of a MOM threshold switch 30" according to this presentation, comprising: a substrate 32" having a surface 34"; a first electrode wire 36" filling a trench 37" extending on surface 34" along a first direction. According to an embodiment of this presentation, a layer or film of vanadium pentoxide 38" extends over surface 34" and over at least a portion of the top surface of electrode wire 36", such that a portion of layer 38" contacts a portion of first electrode 36". The substrate 32" can be $SiO_2$ (or of another common CMOS dielectric such as $SiN_x$, SiCN, SiCOH or porous SiCOH). A second electrode wire 40" extends over layer/film 38" (and thus over surface 34") along a second direction, such that the second electrode wire 40" extends on and contacts at least a portion of the vanadium pentoxide layer 38" above the first electrode wire 36" at a crossing point 42". According to an embodiment of this presentation, a region of vanadium dioxide (not shown in FIG. 4A) is included in vanadium pentoxide layer 38' between the first electrode 36" and the second electrode 40" at crossing point 42". According to an embodiment of this presentation, the region of vanadium dioxide is generally vertical and is preferably close to the geometric center of the crossing point 42".

According to an embodiment of this presentation, the electrodes 36" and 40" can have the same structure as electrodes 36 and 40 above.

Figure 4B:
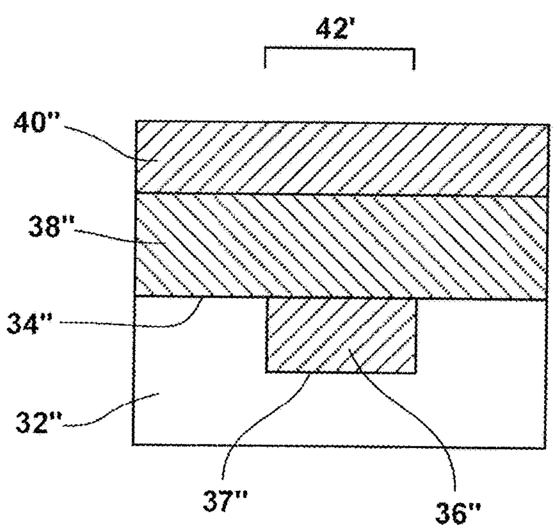
FIG. 4B schematically shows a cross section of a portion of the MOM threshold switch of FIG. 4A.

FIG. 4B illustrates a cross section of a portion of MOM threshold switch 30", along a plane normal to electrode 37 wherein a top surface of electrode 36" is flush, or level in height, with the surface of the substrate 32" on the side of the trench 37".

Figure 5:
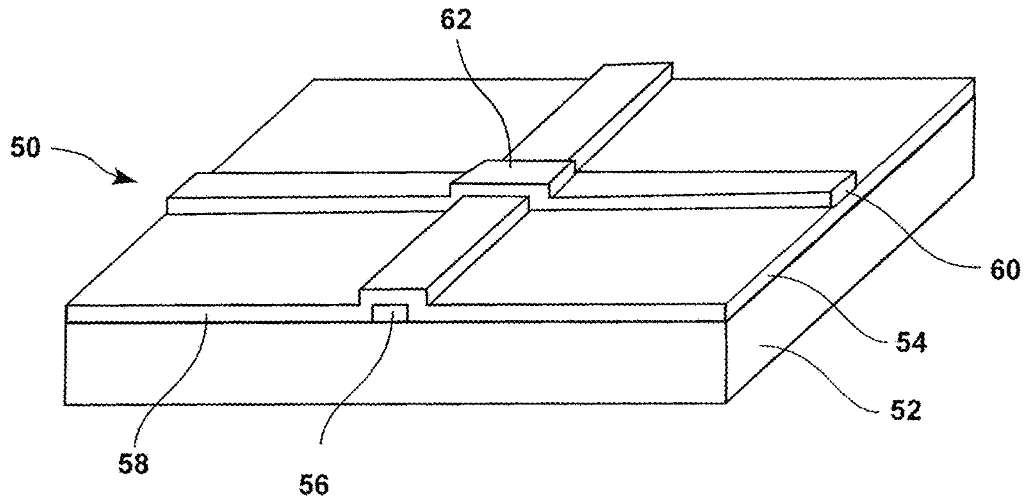
FIG. 5 schematically shows an elevation view of a MOM threshold switch according to this presentation.

FIG. 5 schematically shows an elevation view of a MOM threshold switch 50 according to this presentation, comprising: a substrate 52 having a surface 54; a first electrode wire 56 extending on surface 54 along a first direction and a blanket vanadium pentoxide film or layer 58 extending on, and contacting, at least a portion of first electrode 56. A second electrode wire 60 extends over layer 58 over surface 54 along a second direction, such that the second electrode wire 60 extends over, and contacts, the vanadium pentoxide layer 58 that is over first electrode wire 56 at a crossing point 62. According to an embodiment of this presentation, a region of vanadium dioxide (not shown in FIG. 5) is included in vanadium pentoxide layer 58 between the first electrode 56 and the second electrode 60 at crossing point 62.

According to an embodiment of this presentation, the electrodes 56 and 60 can be the same as electrodes 36 and 40.

Figure 6:
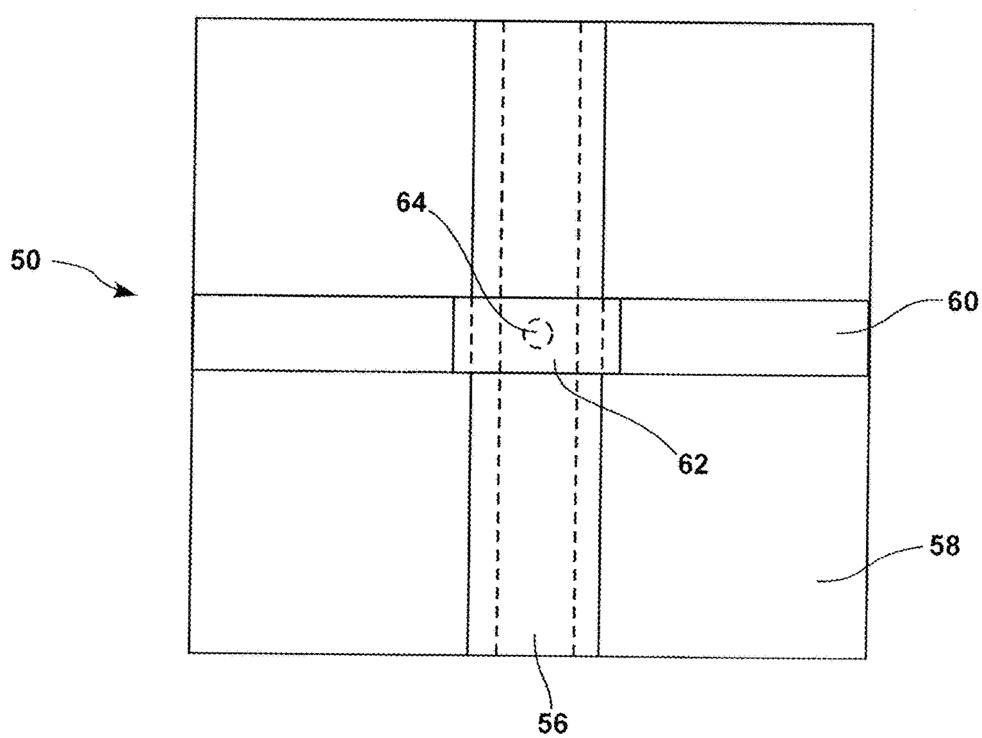
FIG. 6 shows a top view of a MOM threshold switch as shown in FIG. 5.

FIG. 6 shows a top view of the MOM threshold switch 50 as shown in FIG. 5, showing the first electrode wire 56 below blanket vanadium pentoxide layer 58, and second electrode wire 60 extending in particular over the vanadium pentoxide layer 58 that is over first electrode wire 56 at crossing point 62. According to an embodiment of this presentation, a region of vanadium dioxide 64 is included in the vanadium pentoxide layer 58 between the first electrode 56 and the second electrode 60 at crossing point 62. Region 64 is illustrated in relation with device 50, but according to an embodiment of this presentation, region 64 can be found at a similar location in device 30, 30', 30" above. According to an embodiment of this presentation, the region of vanadium dioxide 64 has a radius smaller than 100 nanometer; and preferably smaller than 50 nanometer. According to an embodiment of this presentation, the vanadium pentoxide layer 58 has a thickness smaller than 100 nanometer; and preferably smaller than 50 nanometer. According to an embodiment of this presentation, the substrate 52 is a Si substrate that can be covered with an insulating layer such as $SiO_2$, $SiN_x$ and other appropriate dielectrics.

According to an embodiment of this presentation, one of electrode wires 56 and 60 comprises a protrusion (not shown in the previous figures) extending normal to the surface of the substrate 52 toward the other of electrode wires 56 and 60 in said region of vanadium dioxide. For example, and as detailed hereafter, upper electrode wire 60 can comprise a protrusion or bump close to the geometric center of crossing point region 62, descending into region 64 toward lower electrode wire 56. As detailed hereafter, such a protrusion can be used to electroform region 64 in a vanadium pentoxide layer originally formed in region 62 between the electrode wires.

Figure 7A:
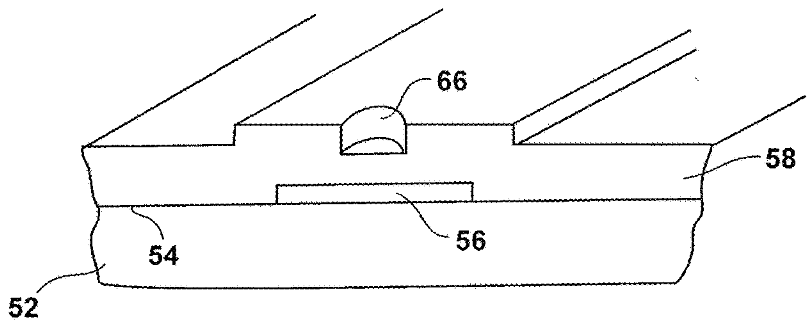
FIGS. 7A to 7C illustrate the manufacturing of a MOM threshold switch according to an embodiment of this presentation, schematically shown in cross-section.
Figure 7B:
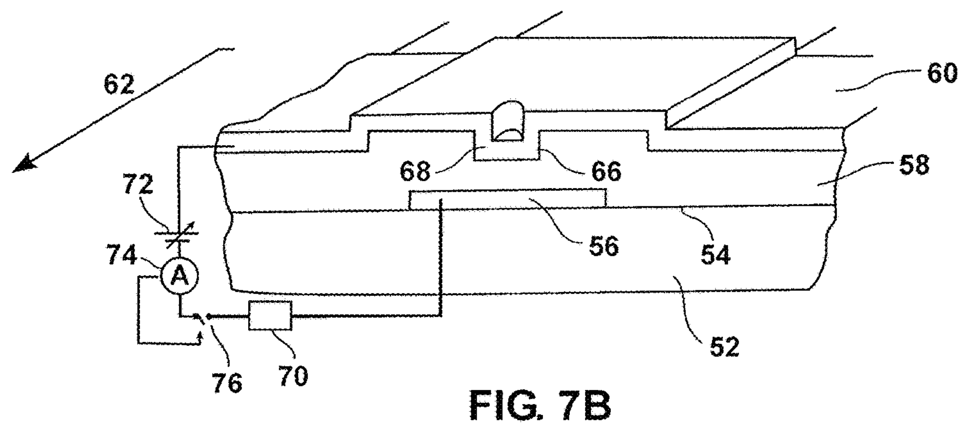
Figure 7C:
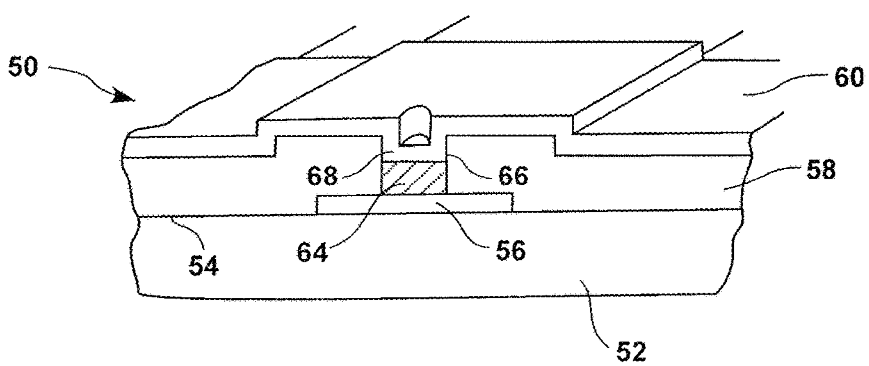

FIGS. 7A to 7C illustrate the manufacturing of a MOM threshold switch, such as device 50 of FIGS. 5 and 6, schematically shown in cross-section. As shown in FIG. 7A, an electrode wire 56 if formed extending along a first direction on a top surface 54 of a substrate 52. A vanadium pentoxide layer 58 is then formed, extending on the portions of surface 54 not covered by electrode 56 and extending on, and contacting, at least a portion of electrode 56. According to an embodiment of this presentation, a recess 66 is then etched in the vanadium pentoxide layer 58 over electrode 56, above a location where it is desired to later form the region of vanadium dioxide 64. According to an embodiment of this presentation, the depth of recess 66 can be of several nanometer to several tens of nanometers, or for example about 10% of the thickness of the layer 58. According to an embodiment of this presentation, recess 66 can be cylindrical (as schematically illustrated) or can follow the trunk of a cone.

As shown in FIG. 7B, an electrode wire 60 if formed extending along a second direction (for example perpendicular to the first direction) on a portion of the vanadium pentoxide layer 58, such that electrode wire 60 extends above, and contacts, electrode wire 56 at a crossing point region 62. According to an embodiment of this presentation, electrode 60 is arranged such that recess 66 is close to the geometric center of crossing point region 62. As illustrated in FIG. 7B, because electrode wire 60 is formed over recess 66, electrode 60 comprises a protrusion 68 extending normal to the surface 54 of substrate 52 toward electrode wire 56 into vanadium pentoxide layer 58. According to an embodiment of this presentation, a current limiting resistor 70 and a controllable voltage source 72 are connected in series between the electrode wires 56 and 60. According to an embodiment of this presentation, a current measurement device 74 and a controllable switch 76 are connected in series between resistor 70 and voltage source 72. According to an embodiment of this presentation, current measurement device 74 is arranged to close controllable switch 76 as long as the current measured by current measurement device 74 is below a predetermined current limit level, and to open controllable switch 76 when the current in resistor 70 reaches said predetermined current limit level. The current limit (compliance) feature prevents device damage after it is electroformed. Resistor 70 provides an always-presenting protection, since the opening of switch 76 has a small but non-negligible time delay. According to an embodiment of this presentation, resistor 70 can have a value in the range of several hundred Ohm to several MOhm, controllable voltage source 72 can be arranged to supply a voltage controllably increasing from 0 to 10V, and the predetermined current limit level can be in the range of several μA to 10 mA. At this juncture, it is noted that resistor 70 is beneficial but not necessary. The value of the resistor determines the maximum possible current flowing in the device. The inventors noticed that the appropriate current limit level to electroform the device is a function of the crossbar junction area. Micrometer-sized devices (electrodes width being 5-20 μm) typically require 1-10 mA to be electroformed, see for example FIG. 9B. Nanoscale devices (electrodes width being 100 nm or less) typically require a much smaller current limit level of 50 μA or less (Data not shown).

According to an embodiment of this presentation, controllable voltage source 74 is controlled to increase the voltage between electrode wires 56 and 60 until the measured current reaches said predetermined level, at which point switch 76 opens. The inventors have discovered that the above controlled increase of the voltage between electrode wires 56 and 60 allows forming a region 64 of vanadium dioxide in the vanadium pentoxide layer 58 between electrode wires 56 and 60. In particular, if there exists a region of reduced thickness in layer 58 between electrode wires 56 and 60, increasing the voltage between electrode wires 56 and 60 as detailed hereabove allows forming the region 64 of vanadium dioxide in layer 58 in said region of reduced thickness. When electrode wire 60 comprises bump 68 extending toward electrode wire 56 into layer 58, a region of reduced thickness is formed in layer 58 between electrode wires 56 and 60 below bump 68 and a region 64 of vanadium dioxide is formed in layer 58 between the bottom of bump 68 and electrode wire 56 when the voltage between electrode wires 56 and 60 is increased as detailed hereabove.

According to an embodiment of this presentation, the layer 58 of vanadium pentoxide can be a nearly pure-phase vanadium pentoxide thin film, with >90% of vanadium pentoxide ($V_2O_5$) and less than 10% of vanadium dioxide ($VO_2$), and free or substantially free of any other V oxidation states ($V^0$, $V^{2+}$, $V^{3+}$), and can be formed using reactive DC (or pulsed DC) sputtering of vanadium metal target in an $Ar/O_2$ mixture, on a unheated $SiO_2/Si$ substrate 52 (after electrode wire 56 is formed, for example using common contact metals such as Ti/Au, Ti/Au/Ti, Cr/Au, Ni/Au; or CMOS compatible contact metals such as Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon. According to an embodiment of this presentation, the as-deposited $V_2O_5$ layer/film 58 is amorphous and has a thickness in the range of 20 to 50 nm (thinner layer is possible). According to an embodiment of this presentation, electrode wires (56, 60) are made of CMOS compatible metal materials such as Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon, thus causing the manufacturing of a device as described herabove to advantageously be fully CMOS Back End Of Line compatible. According to an embodiment of this presentation, the layer 58 of vanadium pentoxide can be formed using reactive RF sputtering of vanadium oxide target in an $Ar/O_2$ mixture or thermal oxidation of V metal films.

FIG. 7C shows a region 64 of vanadium dioxide that was formed in layer 58 between the bottom of bump 68 and electrode wire 56 when the voltage between electrode wires 56 and 60 was increased as detailed hereabove. According to an embodiment of this presentation, the recess 66 as well as the region of vanadium dioxide 64 are substantially cylindrical, or conical or tronconical and have an axis normal to the surface 54 of the substrate 52.

According to an embodiment of this presentation, the device illustrated in FIG. 7B, having a region of reduced thickness between the electrode wires 56 and 60 at crossing point region 62 (before the region 64 is formed), is a programmable device that can be irreversibly programmed by forming the region 64: when no region 64 has been formed in the device, the device can be considered as un-programmed, or in a state "0" (the virgin state); and after the region 64 has been formed, the device can be considered as programmed, or in a state "1". Further and remarkably, due to the electrical properties of the $VO_2$ region 64 as detailed hereafter, the programmed device (i.e. having a state "1") is itself a volatile switch or MOM programmable device that can be used as a transient memory bit that has a default state "1" (high resistance state) and a programmable volatile state "2" (low resistance state). In other words, a programmable device as illustrated in FIG. 7B is a memory cell that can be programmed to three different states: "0", "1" and "2". The programming from state "0" to state "1" is an irreversible process, while the programming from state "1" to "2" is reversible and can be repeated many times.

The electrical characteristics of the un-programmed device and of the programmed device are illustrated hereafter in relation with FIGS. 9A to 9D.

The above-described electrical method to change the chemical composition (or the V oxidation state) of the vanadium pentoxide layer to form the $VO_2$ region 64 conduction channel inside the crossbar junction area 62 allows forming, without requiring a high temperature manufacturing step, a $VO_2$ conduction channel restricted to at least within the crossbar junction area as defined by the top and bottom metal electrodes, or restricted to within a region of reduced thickness in the vanadium pentoxide layer when such region exists. The inventors have noted that in case the metal electrodes have a width of only tens of nanometers, the junction area 62 can be of the hundreds of square nanometer scale order, and a $VO_2$ channel/region 64 having a scale down to tens of square nanometers is made possible. Due to the thermally-driven nature of Mott IMT, the threshold Joule heating power $P_{th}=V_{th}-I_{th}$ ($V_{th}$ and $I_{th}$ are the threshold voltage and the threshold current as shown in FIG. 9C or FIG. 9D) to trigger S-NDR switching in switch 50 is proportional to the volume of the $VO_2$ channel. It is noted that a switch 50 of nanometer scale will have a reduced power consumption that can possibly match biological levels.

Figure 8A:
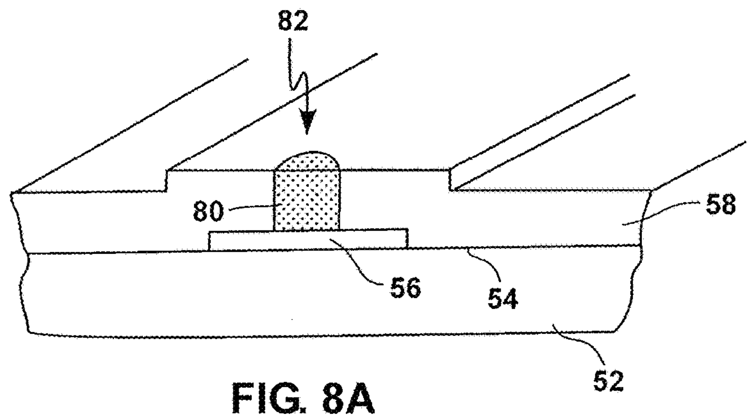
FIGS. 8A to 8C illustrate the manufacturing of a MOM threshold switch according to an embodiment of this presentation, schematically shown in cross-section.
Figure 8B:
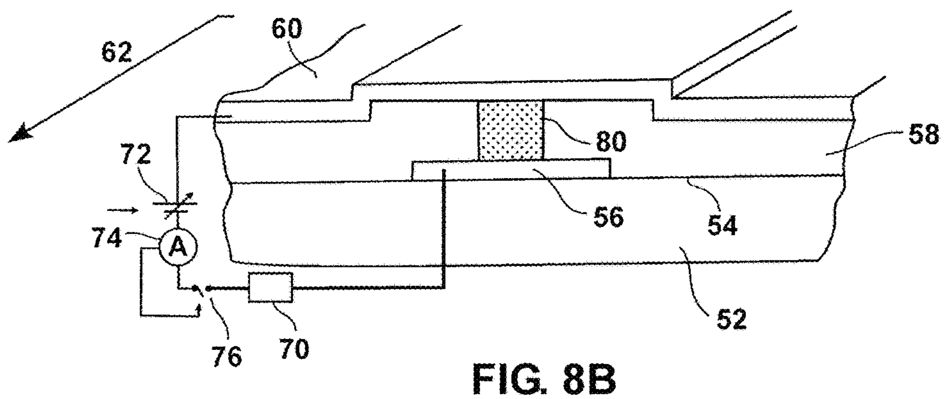
Figure 8C:
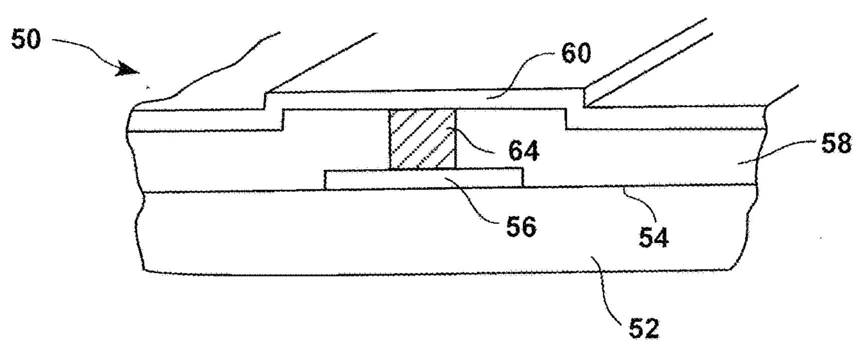

FIGS. 8A to 8C illustrate the manufacturing of a MOM threshold switch, such as device 50 of FIGS. 3 and 4, schematically shown in cross-section. As shown in FIG. 8A, an electrode wire 56 if formed extending along a first direction on a top surface 54 of a substrate 52. A vanadium pentoxide layer 58 is then formed, extending on the portions of surface 54 not covered by electrode 56, and extending on and contacting at least a portion of electrode 56. According to an embodiment of this presentation, a region of heightened conductivity 80 is then formed in the vanadium pentoxide layer 58 over electrode 56, above a location where it is desired to later form the region of vanadium dioxide 64. According to an embodiment of this presentation, the region of heightened conductivity 80 can be formed by depleting layer 58 of oxygen, for example by Reduction of the $V_2O_5$ layer by using contact metals that are easier to be oxidized than V metal; or by High-energy electron or ion beam bombardment of the $V_2O_5$ layer; or by Hydrogen reduction of the $V_2O_5$ layer.

As shown in FIG. 8B, an electrode wire 60 if formed extending along a second direction (for example perpendicular to the first direction) on a portion of the vanadium pentoxide layer 58, such that electrode wire 60 extends above, and contacts, electrode wire 56 at a crossing point region 62. According to an embodiment of this presentation, electrode 60 is arranged such that the region of heightened conductivity 80 is close to the geometric center of crossing point region 62. As illustrated in FIG. 8B according to an embodiment of this presentation the region of heightened conductivity 80 extends normal to the surface 54 of substrate 52, for example from electrode wire 60 to electrode wire 56. According to an embodiment of this presentation the region of heightened conductivity 80 can extends in layer 58 from electrode wire 60 toward electrode wire 56, without reaching electrode wire 56. As disclosed hereabove in relation with FIGS. 7A-C, a current limiting resistor 70 and a controllable voltage source 72 can be connected in series between the electrode wires 56 and 60; and a current measurement device 74 and a controllable switch 76 can be connected in series between resistor 70 and voltage source 72, where current measurement device 74 can be arranged to close controllable switch 76 as long as the current in resistor 70, measured by current measurement device 74 is below a predetermined current level, and to open controllable switch 76 when the current in resistor 70 reaches said predetermined current level.

According to an embodiment of this presentation, controllable voltage source 74 is controlled to increase the voltage between electrode wires 56 and 60 until the current in current limiting resistor 70 reaches said predetermined level, at which point switch 76 opens. The inventors have discovered that the above controlled increase of the voltage between electrode wires 56 and 60 allows forming a region 64 of vanadium dioxide in the vanadium pentoxide layer 58 between electrode wires 56 and 60, where the region of heightened conductivity 80 was.

FIG. 8C shows a region 64 of vanadium dioxide after it was formed in layer 58 substantially in replacement of region 80 between the bottom of bump 68 and electrode wire 56, when the voltage between electrode wires 56 and 60 was increased as detailed hereabove.

Consistently with the device illustrated in FIG. B, the device illustrated in FIG. 8B (with the region 80 of heightened conductivity between the electrode wires 56 and 60 at crossing point region 62, before the region 64 is formed) is a programmable device or cell that can be irreversibly programmed from a state "0" (no region 64) to a state "1" (region 64 formed; in default high resistance state) and then reversibly programmed to a state "1A" (region 64 formed; in volatile low resistance state). The electrical characteristics of the non-programmed device/cell and of the programmed device/cell are illustrated hereafter in relation with FIGS. 9A to 9D.

FIGS. 9A to 9D illustrate the characteristics of a MOM programmable device threshold switch according to embodiments of this presentation. It is noted that FIGS. 9A to 9D relate to micrometer-sized electroformed $VO_2$ devices, while embodiments of this presentation can also have nanometer-sized (for example, 100 nm×100 nm) electroformed $VO_2$ devices (Data not shown).

Figure 9A:
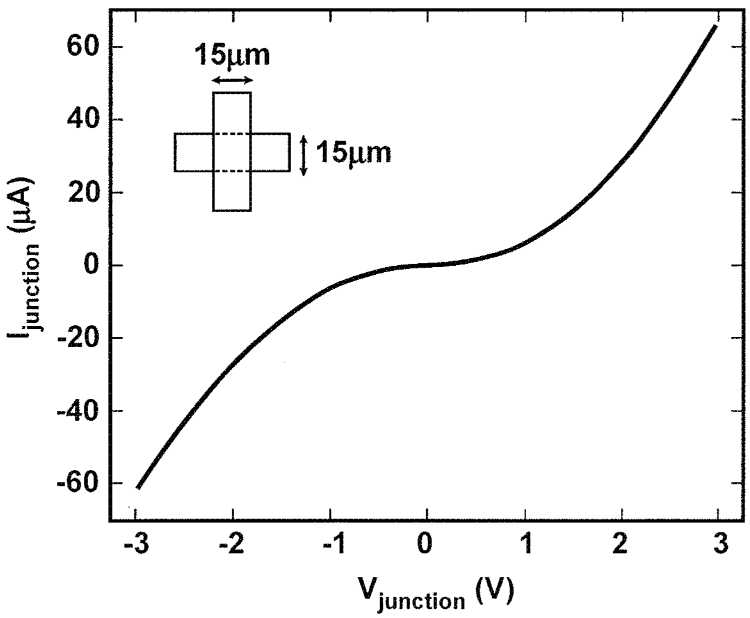
FIGS. 9A to 9D show the characteristics of a MOM threshold switch according to an embodiment of this presentation.

FIG. 9A shows the I-V characteristic of a programmable device as illustrated in FIG. 7B or 8B above, with only vanadium pentoxide between the electrodes 56 and 60 and with electrodes 56 and 60 having each a width of about 15 micrometer. The figure illustrates the high, non-linear resistance of the vanadium pentoxide layer 58.

Figure 9B:
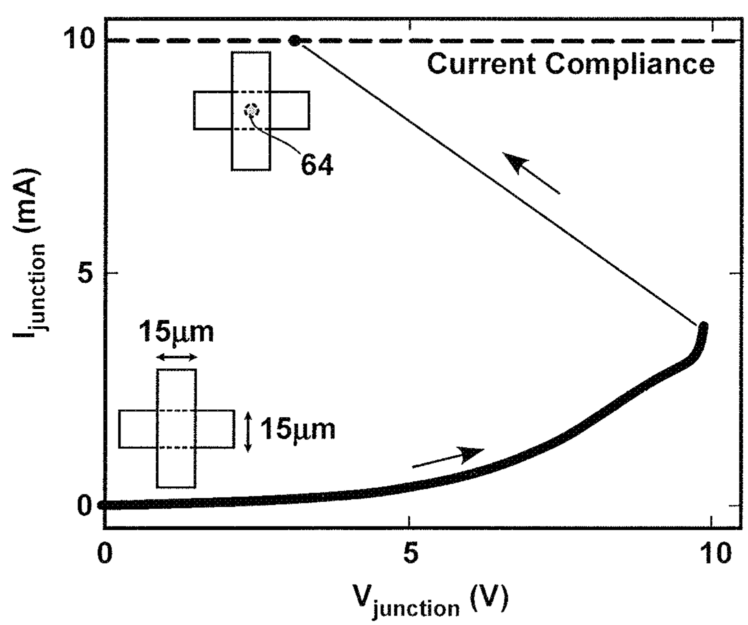
Figure 9C:
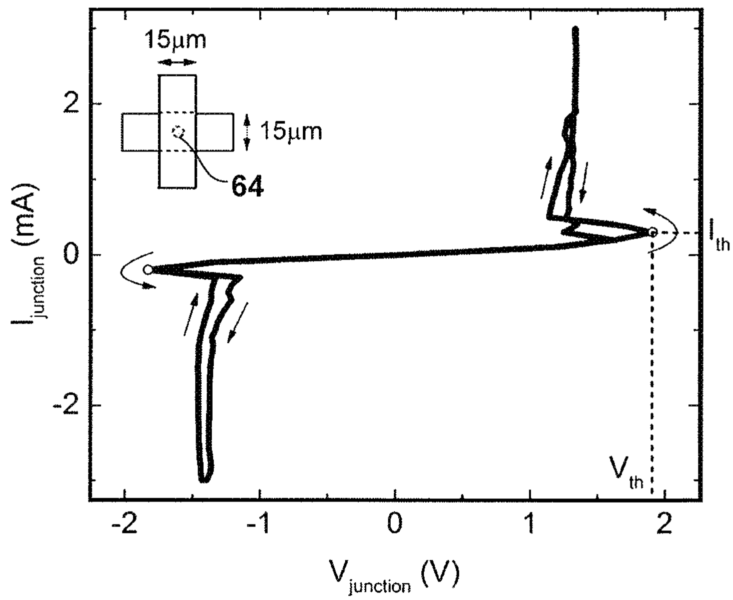
Figure 9D:
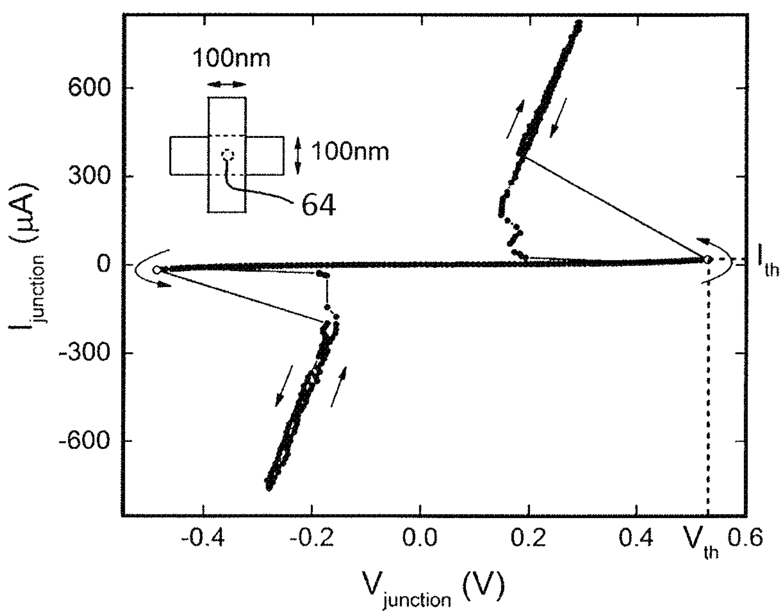

FIG. 9B shows the I-V characteristic of a programmable device as illustrated in FIG. 7B or 8B and 9A above when electroforming region 64 by applying a voltage sweep. As outlined above, the voltage between electrodes 56 and 60 is progressively increased until the current in resistor 70 reaches a preset value (10 mA in FIG. 9B), at which time the voltage supply is cut. According to an embodiment of this presentation, a conductance surge appears abruptly after the voltage between electrodes 56 and 60 reaches a given voltage (10 V in FIG. 9B), which corresponds to the actual formation of lower resistance region 64 in layer 58. As outlined above, cutting the voltage supply when the current in resistor 70 reaches a preset value prevents damaging region 64 and formation of detrimental oxides or of a short circuit between electrodes 56 and 60.

FIG. 9C shows the I-V characteristic of a current-driven programmable device as illustrated in FIG. 7C or 8C (or FIGS. 2-6), and 9A-B above, after region 64 was formed. The inventors performed current-voltage and temperature dependence characterizations of the aforementioned electroformed switch 50, and observed a bidirectional threshold switching behavior. According to an embodiment of this presentation, symmetrical CC-NDR characteristics are observed in both positive and negative voltage polarities with nearly identical threshold voltage and current. This phenomenon is only observed if the environmental temperatures are lower than a critical value close to 65° C. The inventors have noted that this critical temperature matches well with the established Mott IMT temperature of $VO_2$ material. The inventors have noted that the S-NDR I-V characteristics observed at temperatures lower than 65° C. can be explained by a thermally-driven Mott IMT of $VO_2$ conduction channel induced by Joule heating beyond certain power level. According to an embodiment of this presentation, at temperatures lower than 65° C., the $VO_2$ material is a semiconductor, supported by the measured temperature dependence of the zero-bias conductance in switch 50, which follows a thermally activated transport behavior, with a single-exponent activation energy in the range of 0.19 to 0.25 eV that matches well with established values of the $VO_2$ material.

As illustrated for example in relation with FIG. 9C, a switch 50 according to an embodiment of this presentation shows a low voltage threshold current-controlled S-type negative differential resistance (NDR), as well as a resistance On/Off ratio greater than 100. The inventors repeated experimentally the On/Off switching for over 10,000 times on the same device without sign of degradation. In the embodiment illustrated in FIG. 9C having a $V_2O_5$ layer thickness of the order of 50 nanometer and a crossbar junction area of 15×15 square micrometers, a S-NDR switching threshold voltage ($V_{th}$) of about 1.9 V was observed, with threshold current ($I_{th}$) of about 200 μA. As illustrated in FIG. 9D, in an embodiment having a $V_2O_5$ layer thickness of the order of 50 nanometer and a crossbar junction area of 100×100 square nanometers, a S-NDR switching threshold voltage ($V_{th}$) of about 0.5V was observed, with a threshold current ($I_{th}$) of about 18 μA). The 0.5V threshold voltage is 40% lower than the state-of-the-art (0.8V), and the 18 μA threshold current is 97% lower than the state-of-the-art (600 μA) in similar MOM threshold switches (see the reference in [007]). The threshold Joule heating power ($P_{th}=V_{th}-I_{th}$) for the micrometer-sized device in FIG. 9C is 380 μW, and is 9 μW for the nanometer-sized device in FIG. 9D, indicating that the volume of the electroformed $VO_2$ channel is reduced by a factor of 42 simply by scaling down the crossbar junction area. According to an embodiment of this presentation, the device resistance switching and S-NDR is caused by temperature-driven insulator-to-metal phase transition of the $VO_2$ channel 64, induced by Joule heating. According to an embodiment of this presentation, the low transition temperature of 65° C. and the scalability of $VO_2$ channel pose an energy consumption advantage over competing technologies such as $NbO_2$ (with an insulator-to-metal transition temperature at 807° C.). Thus, a switch device according to an embodiment of this presentation allows high-density CMOS-MOM crossbar threshold switch integration for a variety of applications, including high-speed RF switches, oscillators, and spiking-neuron based neuromorphic computing.

Figure 10A:
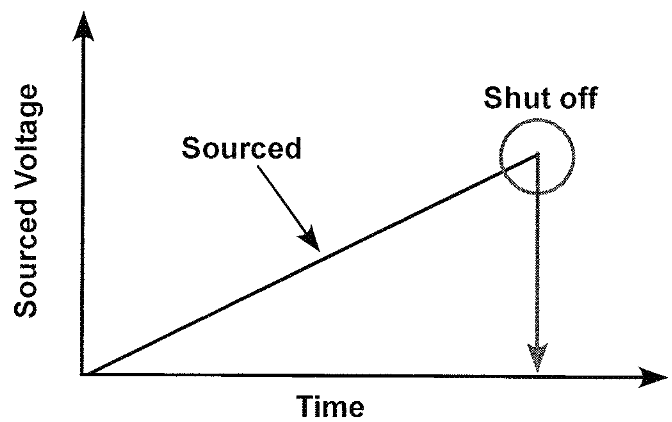
FIGS. 10A and 10B illustrate the voltage and current across a MOM threshold switch according to an embodiment of this presentation when electroforming the vanadium oxide.
Figure 10B:
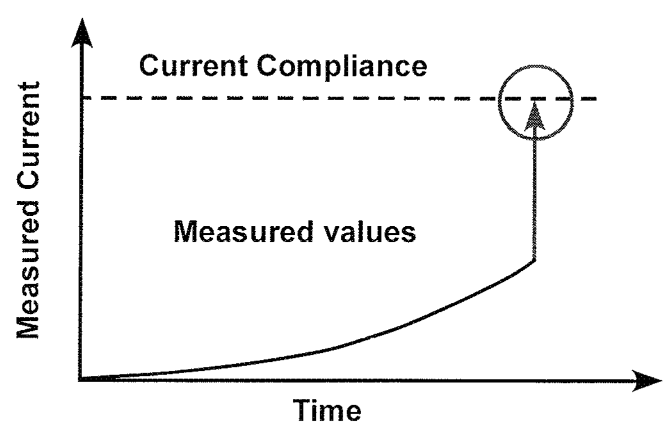

FIGS. 10A and 10B illustrate the voltage and current across a MOM threshold switch according to an embodiment of this presentation when electroforming the vanadium oxide. As illustrated in FIG. 10A, the voltage source 74 can be controlled so as to increase along a ramp. As illustrated in FIG. 10B, the current in resistor 70 increases steadily until a conductance surge appears and the current abruptly reaches the preset value at which the switch 76 is opened (or source 72 is cut). According to an embodiment of this presentation, and even though FIG. 10A shows a linear voltage ramps, other forms of voltage ramps, such as a logarithmic function of time, can be used.

Figure 11:
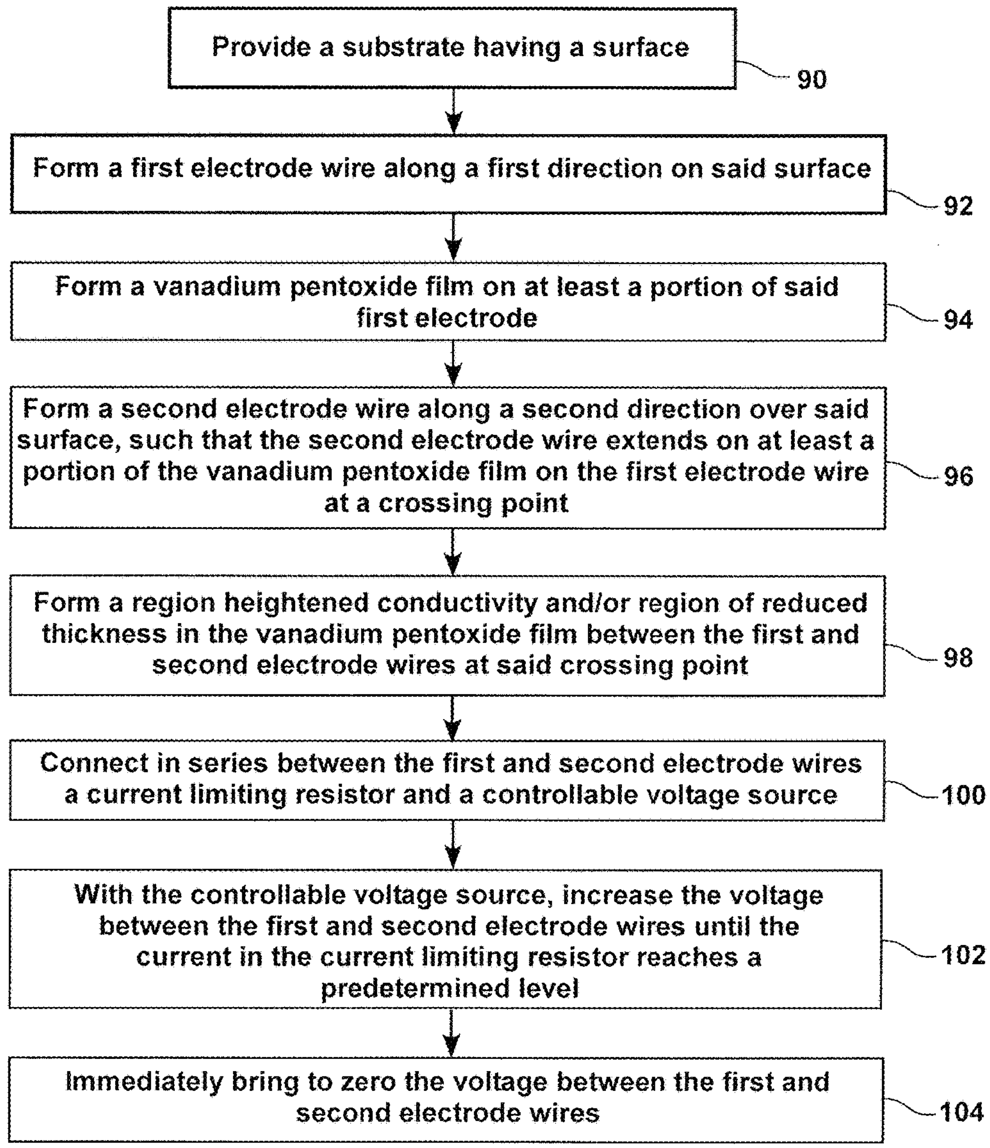
FIG. 11 illustrates a method of manufacturing of a MOM threshold switch according to an embodiment of this presentation.

FIG. 11 illustrates a method of manufacturing of a MOM threshold switch according to an embodiment of this presentation; the method comprising:

Providing 90 a substrate having a surface;

Forming 92 a first electrode wire along a first direction on said surface;

Forming 94 a vanadium pentoxide layer on at least a portion of said first electrode; and Forming 96 a second electrode wire along a second direction over said surface, such that the second electrode wire extends on at least a portion of the vanadium pentoxide layer on the first electrode wire at a crossing point.

According to an embodiment of this presentation, the method further comprises: forming 98 a region of heightened conductivity and/or a region of reduced thickness in the vanadium pentoxide layer between the first and second electrode wires at said crossing point.

According to an embodiment of this presentation, the method further comprises: connecting 100 in series between the first and second electrode wires an optional current limiting resistor and a controllable voltage source;

With the controllable voltage source, increasing 102 the voltage between the first and second electrode wires until the current in the current limiting resistor reaches a predetermined level; and Immediately bringing to zero 104 the voltage between the electrodes wire upon the current in the current limiting resistor reaching a predetermined level.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

Figure 12:
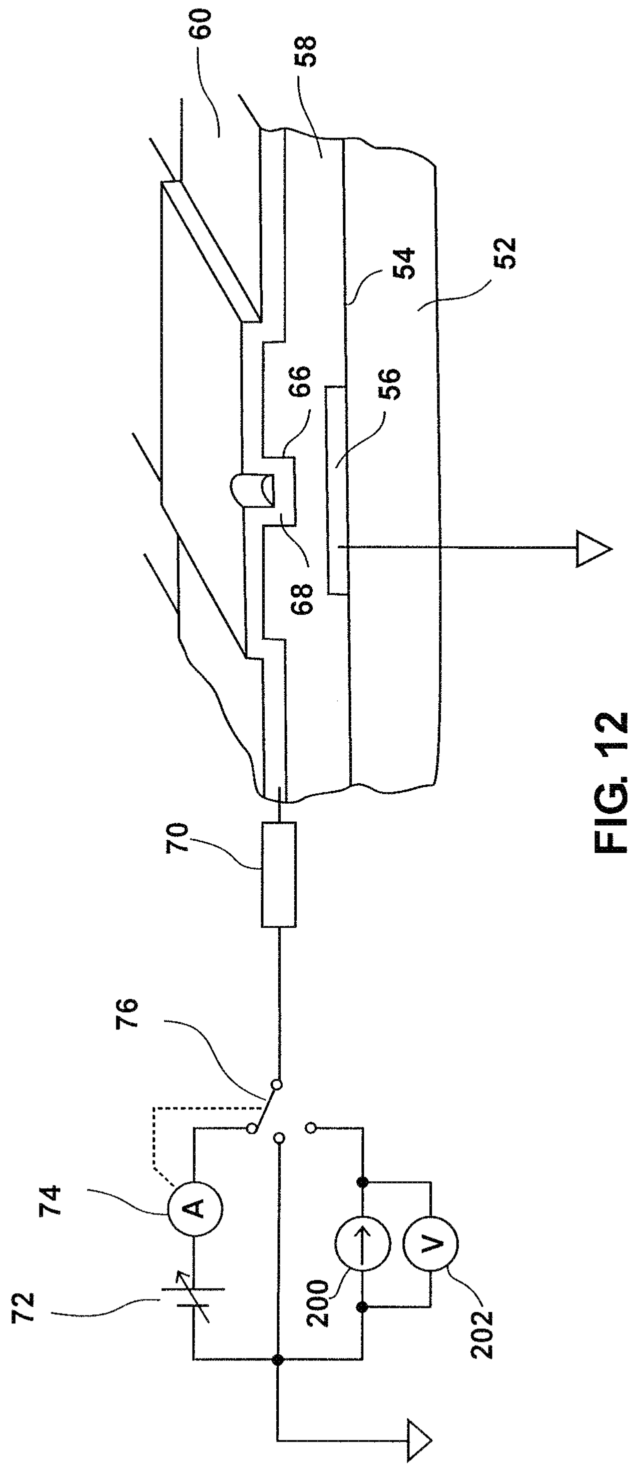
FIG. 12 illustrates an alternative circuit of control of the programmable device illustrated in FIG. 7B (or 8B) according to an embodiment of this presentation.

FIG. 12 illustrates an alternative circuit of control of the programmable device illustrated in FIG. 7B (or 8B) according to an embodiment of this presentation. In this embodiment, electrode wire 56 is connected to the ground and (optional) resistor 70 is connected in series between electrode wire 60 and controllable switch 76, current measurement device 74, controllable voltage source 72 and the ground. Further, in this embodiment controllable switch 76 is controllable to connect electrode wire 60 to the ground, in series with resistor 70, when the measured current reaches the predetermined current limit level. Alternatively, instead of switch 76 disconnecting the voltage source 72 from electrode wire 60, voltage source 72 can be shut off when the measured current reaches the predetermined current limit level. FIG. 12 also shows that controllable switch 76 has a third position allowing a controllable current source 200 to control the current sent to electrode wire 60. When using current source 200, a voltage measurement device 202 is used to measure for example the voltage drop over current source 200 to determine when the predetermined voltage limit level (voltage compliance) is reached. According to an embodiment of this presentation, current source can be used in replacement of voltage source 72 to form region 64, by either disconnecting the current source 200 from electrode wire 60, or by shutting off the current source 200, when the predetermined voltage limit level is reached.

Figure 13:
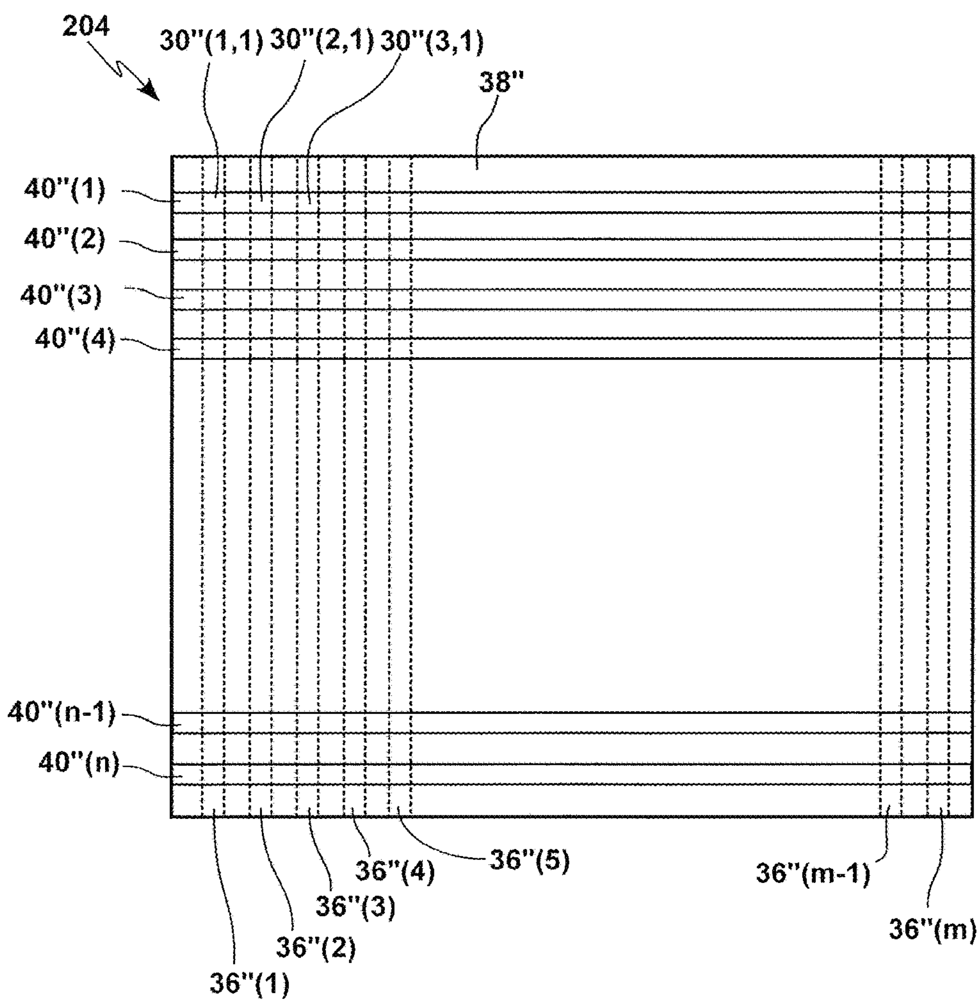
FIG. 13 illustrates schematically a top view of an array 204 of devices 30" according to an embodiment of this presentation.

FIG. 13 illustrates schematically a top view of an array 204 of devices 30" as detailed in relation with FIG. 4A, arranged along n rows and m columns; where each device 30"(i,j) with i=1,n and j=1,m is arranged at the crossing point of a row electrode 40"(j) and a column electrode 36"(i). It is noted that with nanometric scale electrodes 40" and 36", the array 204 is capable of integrating a large number of devices 30" over a small surface. It is noted that any of the electronic devices according to embodiments of this presentation can be arranged along an array as illustrated in FIG. 13. Array 204 is not limited to device 30" of FIG. 4A.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An electronic device comprising:

a substrate having a surface;

a first electrode wire extending on said surface along a first direction;

a vanadium pentoxide layer extending on and contacting at least a portion of said first electrode;

a second electrode wire extending over said surface along a second direction, such that the second electrode wire extends on and contacts at least a portion of the vanadium pentoxide layer above the first electrode wire at a crossing point, said vanadium pentoxide layer having a first thickness between the first and second electrode wires;

wherein a region of vanadium dioxide is included in said vanadium pentoxide layer between the first and second electrodes at said crossing point, such that the region of vanadium dioxide contacts both the first and second electrode wires; and wherein one of the first and the second electrode wires comprises a protrusion extending normal to said surface toward the other of the first and second electrode wires in said region of vanadium dioxide; said region of vanadium dioxide that contacts both the first and second electrode wires having a reduced thickness with respect to said first thickness.

2. The electronic device of claim 1, wherein said vanadium pentoxide layer is disposed within a recess in a dielectric layer formed over said first electrode wire and at least part of said surface not covered by said first electrode wire.

3. The electronic device of claim 1, wherein said first electrode wire fills a trench formed in said surface.

4. The electronic device of claim 3, wherein a top surface of said first electrode wire is level in height with the surface of the substrate on the side of said trench.

5. The electronic device of claim 1, wherein the substrate is a Si substrate covered with a layer of $SiO_2$, $SiN_x$, SiCN, SiCOH or porous SiCOH.

6. The electronic device of claim 1, wherein at least one of the first and second electrode wires comprises one layer or multiple layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon.

7. A programmable electronic device comprising:

a substrate having a surface;

a first electrode wire extending on said surface along a first direction;

a vanadium pentoxide layer extending on and contacting at least a portion of said first electrode wire;

a second electrode wire extending over said surface along a second direction, such that the second electrode wire extends on and contacts at least a portion of the vanadium pentoxide layer above the first electrode wire at a crossing point, said vanadium pentoxide layer having a first thickness between the first and second electrode wires;

wherein a region of said vanadium pentoxide layer between the first and second electrode wires comprises vanadium pentoxide having heightened conductivity; or a region of said vanadium pentoxide layer in contact with both the first and second electrode wires has a reduced thickness with respect to said first thickness between the first and second electrode wires at said crossing point.

8. The programmable electronic device of claim 7, wherein said vanadium pentoxide layer comprises said region of reduced thickness between the first and second electrode wires at said crossing point and wherein said region of reduced thickness comprises a protrusion in one of the first and the second electrode wires, said protrusion extending normal to said surface toward the other of the first and second electrode wires.

9. The programmable electronic device of claim 7, wherein said vanadium pentoxide layer comprises said region of vanadium pentoxide having heightened conductivity between the first and second electrode wires at said crossing point and wherein said vanadium pentoxide having heightened conductivity comprises vanadium pentoxide depleted of oxygen.

10. The programmable electronic device of claim 7, additionally comprising a commutator for controllably connecting in series between the first and second electrode wires a current limiting resistor and a controllable voltage source; the controllable voltage source being provided for increasing the voltage between the first and second electrode wires until the current in the current limiting resistor reaches a predetermined level.

11. The programmable electronic device of claim 10, wherein said vanadium pentoxide layer is comprised within a recess in a dielectric layer formed over said first electrode wire and the portions of said surface not covered by said first electrode wire.

12. The programmable electronic device of claim 10, wherein said first electrode wire fills a trench formed in said surface.

13. The electronic device of claim 12, wherein a top surface of said first electrode wire is level in height with the surface of the substrate on the side of said trench.

14. A method of manufacturing an electronic device comprising:

providing a substrate having a surface;

forming a first electrode wire along a first direction on said surface;

forming a vanadium pentoxide layer on and in contact with at least a portion of said first electrode; and forming a second electrode wire along a second direction over said surface, such that the second electrode wire extends on and contacts at least a portion of the vanadium pentoxide layer above the first electrode wire at a crossing point;

the method further comprising:

forming a region of vanadium pentoxide layer contacting both the first and second electrode wires and of reduced thickness in the vanadium pentoxide layer by forming in one of the first and the second electrode wires a protrusion extending normal to said surface toward the other of the first and second electrode wires; or forming a region of vanadium pentoxide layer of heightened conductivity in the vanadium pentoxide layer between the first and second electrode wires at said crossing point.

15. The method of claim 14, wherein the method comprises forming a region of vanadium pentoxide layer of reduced thickness in the vanadium pentoxide layer by forming in one of the first and the second electrode wires a protrusion extending normal to said surface toward the other of the first and second electrode wires and wherein said protrusion is substantially conical, with an axis normal to said surface.

16. The method of claim 14, wherein said method comprises forming a region of vanadium pentoxide layer of heightened conductivity in the vanadium pentoxide layer between the first and second electrode wires at said crossing point; and wherein said forming a region of vanadium pentoxide layer of heightened conductivity in the vanadium pentoxide layer comprises locally depleting the vanadium pentoxide of oxygen in said region of the vanadium pentoxide layer.

17. The method of claim 16, wherein depleting the vanadium pentoxide of oxygen comprises using one of:

a reduction process using reductive contact metals;

a high-energy electron bombardment;

a high energy ion beam bombardments; and a hydrogen reduction.

18. The method of claim 14, wherein said forming a vanadium pentoxide layer on and in contact with at least a portion of said first electrode wire comprises:

forming a dielectric layer formed over said first electrode wire and the portions of said surface not covered by said electrode;

etching a recess in said dielectric layer over said at least a portion of said first electrode wire; and forming a vanadium pentoxide layer within said recess.

19. The method of claim 14, wherein said forming a first electrode wire along a first direction on said surface comprises etching a trench in said surface; and filling said trench with said first electrode wire.

20. The method of claim 14, wherein a top surface of said first electrode wire is level in height with the surface of the substrate on the side of said trench.

21. The method of claim 14, wherein the substrate is a Si substrate covered with a layer of $SiO_2$, $SiN_x$, SiCN, SiCOH or porous SiCOH.

22. The method of claim 14, wherein at least one of the first and second electrode wires comprises one layer or multiple layers of Cr, Ti, Co, Ni, Pt, Pd, Al, Cu, Mo, Ta, W, TiW, TiN, TaN, WN, $TiSi_2$, $WSi_2$, $MoSi_2$, $TaSi_2$, NiSi, $CoSi_2$, and doped polysilicon.

23. The method of claim 14, further comprising electroforming a region of vanadium dioxide in said region of heightened conductivity in the vanadium pentoxide layer.

24. The method of claim 23, wherein said electroforming a region of vanadium dioxide in said region of heightened conductivity in the vanadium pentoxide layer comprises:

connecting in series between the first and second electrode wires a current limiting resistor and a controllable voltage source; and with the controllable voltage source, increasing the voltage between the first and second electrode wires until the current in the current limiting resistor reaches a predetermined level.

* * * * *